(12) United States Patent
Boerstler et al.

(10) Patent No.: US 6,335,650 B1
(45) Date of Patent: Jan. 1, 2002

(54) METHOD AND APPARATUS FOR ADJUSTING TIME DELAYS IN CIRCUITS WITH MULTIPLE OPERATING SUPPLY VOLTAGES

(75) Inventors: David William Boerstler, Round Rock; Harm Peter Hofstee; Hung Cai Ngo, both of Austin; Kevin John Nowka, Round Rock, all of TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/670,829

(22) Filed: Sep. 28, 2000

(51) Int. Cl.⁷ .............................................. H03H 11/26
(52) U.S. Cl. ........................................ 327/261; 327/530
(58) Field of Search .................... 327/530, 540–544, 327/545, 141–143, 270, 276, 278, 280, 281, 261; 326/80–87

(56) References Cited

U.S. PATENT DOCUMENTS 4,591,745 A * 5/1986 Shen ........................... 327/413
5,747,972 A * 5/1998 Baretich et al. ............. 323/223

* cited by examiner

Primary Examiner—My-Trang Nu Ton
(74) Attorney, Agent, or Firm—Casimer K. Salys; Bracewell & Patterson, L.L.P.

(57) ABSTRACT

A method and apparatus for adjusting time delays in circuits with multiple operating supply voltages are disclosed. A voltage level detector and a delay means are coupled to a critical timing circuit of an integrated circuit capable of operating at multiple supply voltages. The voltage level detector detects a supply voltage at which the integrated circuit is operating. When the operating supply voltage of the integrated circuit changes from a first voltage level to a second voltage level, the voltage level detector sends a signal to the delay means and to a current enhancement circuit such that the delay means and current enhancement circuit can automatically modify the delay of the switching time of an output signal from the critical timing circuit.

14 Claims, 2 Drawing Sheets

METHOD AND APPARATUS FOR ADJUSTING TIME DELAYS IN CIRCUITS WITH MULTIPLE OPERATING SUPPLY VOLTAGES

BACKGROUND OF THE INVENTION

1. Technical Field

The present invention relates to integrated circuits in general, and in particular to integrated circuits having multiple operating supply voltages. Still more particularly, the present invention relates to a method and apparatus for adjusting time delays of critical timing circuits within an integrated circuit having multiple operating supply voltages.

2. Description of the Prior Art

Some integrated circuits are required to operate at a wide range of supply voltages. Generally speaking, the operating speed of logic gates within an integrated circuit is typically higher when operating at a high voltage than at a low voltage. Thus, in most cases, it is usually favorable to have an integrated circuit operating at a high supply voltage; however, certain critical timing circuits require to be operated at a predetermined range of speed, and an operating speed beyond the predetermined range attributed from a high supply voltage may cause early mode timing failures to the critical timing circuits.

In the prior art, delay circuits are commonly added to critical timing circuits to ensure correct operating condition can be achieved even at a high supply voltage. Specifically, each of the delay circuits has a fixed amount of time delay, and correct timing in a critical timing circuit can be achieved by adding a delay circuit with the proper amount of time delay to the critical timing circuit. Even though the delay circuits can provide correct timing for the critical timing circuits when the integrated circuit is operating at a high supply voltage level, but the delay circuits also degrade the speed performance of all logic circuits within the integrated circuit during low supply voltage operations. Consequently, it would be desirable to provide an improved method and apparatus for adjusting time delays in critical timing circuits within an integrated circuit having multiple operating supply voltages.

SUMMARY OF THE INVENTION

In accordance with a preferred embodiment of the present invention, a voltage level detector and a delay means are coupled to a critical timing circuit of an integrated circuit that is capable of operating at multiple supply voltages. The voltage level detector detects a supply voltage at which the integrated circuit is operating. When the circuit operates at a high voltage level, the delay of the critical timing circuit increases. When the circuit operates at a low voltage level, the delay of the critical timing circuit decreases. Delays of the critical timing circuit are increased by introducing delay elements in the switching path and by disabling output current enhancement devices. Delays of the critical timing circuit are decreased by eliminating the delay elements and enabling the output current enhancement devices.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
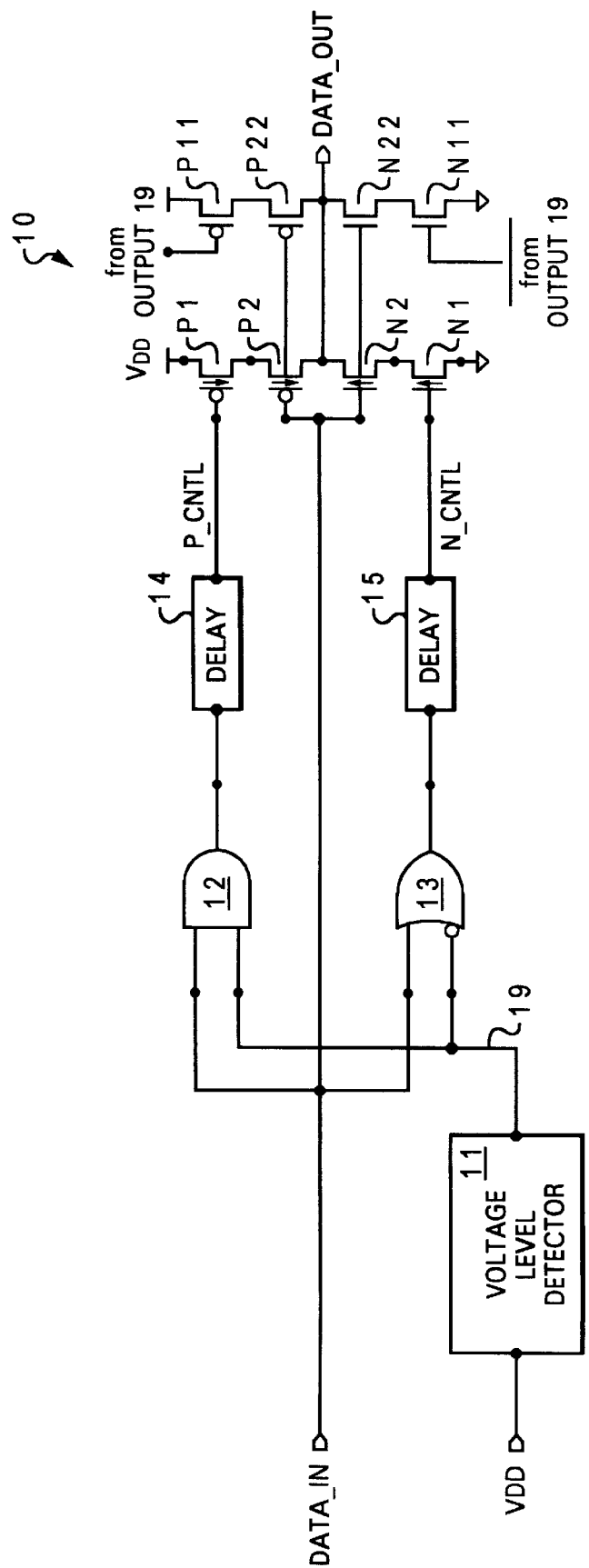
FIG. 1 is a circuit diagram of a driver circuit in accordance with a preferred embodiment of the present invention.

In order to illustrate the principle of the present invention, a critical timing (or timing sensitive) circuit is depicted as a driver (inverter) circuit as an example. Referring now to the drawings and in particular to FIG. 1, there is illustrated a circuit diagram of a driver circuit in accordance with a preferred embodiment of the present invention. As shown, a driver circuit 10 includes p-channel transistors P1, P2, P11, P22 and n-channel transistors N1, N2, N11, N22. Driver circuit 10 can operate in one of two power supply levels, namely, a high voltage level and a low voltage level.

A voltage level detector 11 and delay means are coupled to driver circuit 10. The delay means includes a two-input AND gate 12, a two-input OR gate 13, and delay circuits 14, 15. Voltage level detector 11 determines whether the voltage level of power supply voltage $V_{DD}$ for driver circuit 10 is at a high voltage level or at a low voltage level. When power supply voltage $V_{DD}$ is at a high voltage level, voltage level detector 11 produces a logical "1" signal at output 19. When power supply voltage $V_{DD}$ is at a low voltage level, voltage level detector 11 produces a logical "0" signal at output 19. In response to the logical signal appears at output 19, the delay means generates a P_CNTL signal and a N_CNTL signal to control the time delays of driver circuit 10. In addition, in response to output 19 the current at the output of driver circuit 10 (i.e., DATA_OUT) may be enhanced through transistors N11 and N22 or transistors P11 and P22.

Certain integrated circuits are designed to be able to operate at either a low voltage level or a high voltage level. The low voltage level may be utilized for battery powered low-power operations, and the high voltage level may be high-power high performance operations. Under the current technology, a low voltage level is approximately 0.8 V and a high voltage level is approximately 1.9 V.

Table I illustrates the logic states at various nodes within the delay means and driver circuit 10. When a logical "0" signal is being produced at output 19 of voltage level detector 11, the P_CNTL signal from the output of delay circuit 14 is logically low, and transistor P1 is turned on. Similarly, when a logical "0" signal is being produced at output 19 of voltage level detector 11, the N_CNTL signal from the output of delay circuit 15 is logically high, and transistor N1 is also turned on. As a result, the output of driver circuit 10 (i.e., DATA_OUT) is complementary to the river circuit 10 (i.e., DATA_IN).

TABLE I

| output 19 | P_CNTL | N_CNTL | DATA_IN | DATA_OUT |
|---|---|---|---|---|
| 0 | 0 | 1 | 0 | 1 |
| 0 | 0 | 1 | 1 | 0 |
| 1 | 0 (delay) | 0 (delay) | 0 | 1 (delay) |
| 1 | 1 (delay) | 1 (delay) | 1 | 0 (delay) |

When a logical "1" signal is being produced at output 19 of voltage level detector 11, delay circuit 14 outputs a P_CNTL signal with the same logical state as the DATA_

IN signal, after an predetermined amount of delay from delay circuit 14. When a logical "1" signal is being produced at output 19 of voltage level detector 11, delay circuit 15 outputs an N_CNTL signal with the same logical state as the DATA_IN signal, after an predetermined amount of delay from delay circuit 15.

In essence, when driver circuit 10 is operating at a low voltage level, a logical "0" signal is being produced at output 19 of voltage level detector 11, and both transistors P1 and N1 are continuously turned on during the entire time when driver circuit 10 is operating at the low voltage level. As such, DATA_IN signal goes through driver circuit 10, which includes transistor P2 and transistor N2 connected in an inverter configuration, without any extra delay from either delay circuit 14 or delay circuit 15. In addition, transistors P11 and N11 are continously turned on when output 19 is at a low state (i.e., logical "0"), and additional output current is supplied through transistor P22 and N22 in response to DATA_IN.

However, when driver circuit 10 is operating at a high voltage level, a logical "1" signal is being produced at output 19 of voltage level detector 11 and only one of transistors P1 and N1 is momentarily turned on after a delay from either one of delay circuit 14 or delay circuit 15, according to the DATA_IN signal. Transistors P1 or N1 will only be turned on for the duration of the DATA_IN signal. As such, DATA_IN signal goes through driver circuit 10, which includes transistor P2 and transistor N2 connected in an inverter configuration, with an extra delay from either delay circuit 14 or delay circuit 15, depending on the logical state of the DATA_IN signal. In addition, transistors P11 and N11 are turned off when output 19 is at a high state (i.e., logical "1" ), so transistors P22 and N22 do not contribute to the switching of DATA_OUT.

Figure 2:
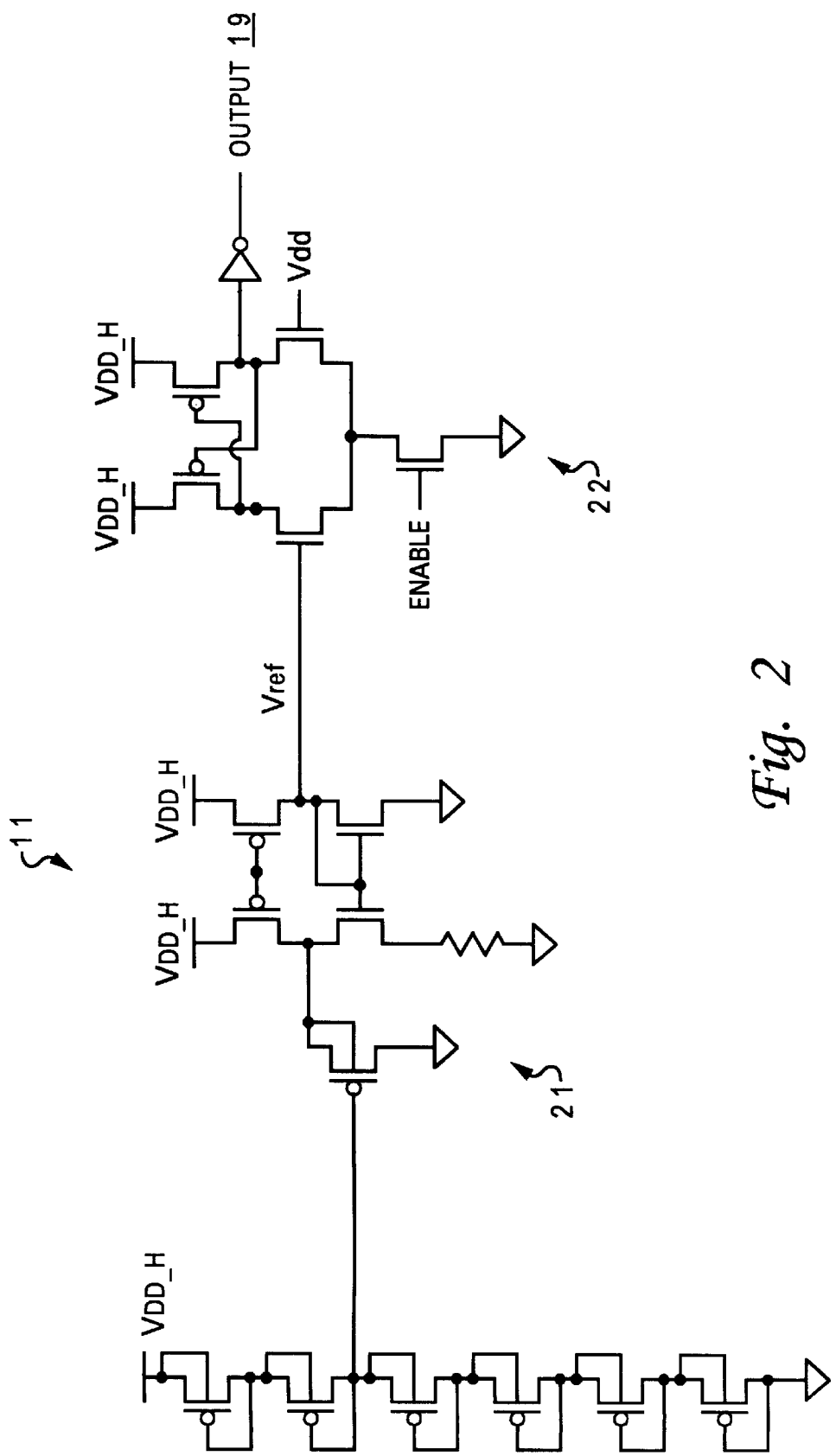
FIG. 2 is a circuit diagram of a voltage level detector in accordance with a preferred embodiment of the present invention.

With reference now to FIG. 2, there is illustrated a circuit diagram of voltage level detector 11 in accordance with a preferred embodiment of the present invention. As shown, voltage level detector 11 includes a reference voltage generator 21 and a voltage comparator 22. Reference voltage generator 21 includes a PFET bias circuit and a CMOS Vt reference circuit. The PFET bias circuit is utilized to avoid the zero-current stable state. The CMOS Vt reference circuit produces a voltage reference, $V_{ref}$, which is relatively independent of the high voltage supply VDD_H.

Voltage comparator 22 is a voltage amplifier that indicates when the supply voltage $V_{dd}$ exceeds the reference voltage $V_{ref}$. If the supply voltage $V_{dd}$ exceeds the reference voltage $V_{ref}$, a logical "1" will appear at output 19. Otherwise, if the supply voltage $V_{dd}$ does not exceed the reference voltage $V_{ref}$, a logical "0" will appear at output 19. As an example for voltage level detector 11, $V_{ref}$ is 1.0 V and $V_{DD\_H}$ is 1.8 V.

As has been described, the present invention provides an improved method and apparatus for adjusting a time delay of a critical timing circuit within an integrated circuit that is capable of operating at multiple supply voltages. The prior art design requires a fixed delay circuit to be added in a critical timing circuit, and the fixed delay circuit degrades the overall performance of the entire integrated circuit. The present invention allows the delay of a time critical circuit to be automatically adjusted based upon the operating supply voltage, and only introduces delay when necessary. The introduction of delay element in the switching path and the enhancement of the output current described in the preferred embodiment may be individually and separately employed. Although a voltage level detector for only two supply voltage levels is utilized to illustrated the present invention, it is understood by those skilled in the art that a voltage level detector capable of detecting more than two voltages can be utilized to increase the number of supply voltage options supported.

While the invention has been particularly shown and described with reference to a preferred embodiment, it will be understood by those skilled in the art that various changes in form and detail may be made therein without departing from the spirit and scope of the invention.

What is claimed is:

1. An apparatus for adjusting a time delay of a timing-sensitive circuit within an integrated circuit subject to variations in DC supply voltage levels, said apparatus comprising:

a timing-sensitive circuit varying in operating speed depending on the voltage level of a supply voltage;

a voltage level detector, coupled to said timing-sensitive circuit, for detecting a supply voltage level;

a delay circuit, coupled to said timing-sensitive circuit, for changing the operating speed of said timing-sensitive circuit from a first operating speed to a second operating speed in response to a change in supply voltage level from a first voltage level to a second voltage level.

2. The apparatus according to claim 1, wherein said first voltage level is lower than said second voltage level.

3. The apparatus according to claim 1, wherein said voltage level detector includes a reference voltage generator and a voltage comparator.

4. The apparatus according to claim 3, wherein said reference voltage generator includes a bias circuit and a Vt reference circuit.

5. The apparatus according to claim 1, wherein said first voltage level is approximately 0.8 V and said second voltage is approximately 1.9 V.

6. The method according to claim 1, wherein said first voltage level is approximately 0.8 V and said second voltage is approximately 1.9 V.

7. A method for adjusting a time delay of a timing-sensitive circuit within an integrated circuit subject to variations in DC supply voltage levels, said method comprising the steps of:

detecting a supply voltage at which said integrated circuit is operating; and in response to a change in supply voltage level from a first voltage level to a second voltage level, delaying the generation of an output signal from said timing-sensitive circuit by introducing delays to said timing-sensitive circuit, such that said timing-sensitive circuit cannot operate beyond a predetermined range of operating speed.

8. The method according to claim 7, wherein said first voltage level is lower than said second voltage level.

9. The method according to claim 7, wherein said detecting step is performed by a voltage level detector having a reference voltage generator and a voltage comparator.

10. The method according to claim 9, wherein said reference voltage generator includes a bias circuit and a Vt reference circuit.

11. An apparatus for adjusting a time delay of a timing-sensitive circuit within an integrated circuit subject to variations in DC supply voltage levels, said apparatus comprising:

a timing-sensitive circuit required to be operated within predetermined range of operating speed;

a voltage level detector, coupled to said timing-sensitive circuit, for detecting a supply voltage level;

a delay circuit, coupled to said timing-sensitive circuit, for introducing delays to said timing-sensitive circuit in response to a change in supply voltage level from a first voltage level to a second voltage level, such that said timing-sensitive circuit cannot operate beyond a predetermined range of operating speed.

12. The apparatus according to claim 11, wherein said first voltage level is lower than said second voltage level.

13. The apparatus according to claim 11, wherein said voltage level detector includes a reference voltage generator and a voltage comparator.

14. The apparatus according to claim 13, wherein said reference voltage generator includes a bias circuit and a $V_t$ reference circuit.

* * * * *